(12) United States Patent
Yudovsky et al.

(10) Patent No.: US 9,856,561 B2
(45) Date of Patent: Jan. 2, 2018

(54) AUTO-REFILL AMPOULE AND METHODS OF USE

(71) Applicant: Applied Materials, Inc., Santa Clara, CA (US)

(72) Inventors: Joseph Yudovsky, Campbell, CA (US); Kenric Choi, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 154 days.

(21) Appl. No.: 14/689,458

(22) Filed: Apr. 17, 2015

(65) Prior Publication Data

US 2015/0299858 A1 Oct. 22, 2015

Related U.S. Application Data

(60) Provisional application No. 61/981,715, filed on Apr. 18, 2014.

(51) Int. Cl.
*F16K 11/02* (2006.01)
*C23C 16/448* (2006.01)
*C23C 16/44* (2006.01)

(52) U.S. Cl.
CPC ...... *C23C 16/4481* (2013.01); *C23C 16/4408* (2013.01); *Y10T 137/87676* (2015.04)

(58) Field of Classification Search
CPC .............. C23C 14/243; C23C 16/4481; Y10T 137/2554; Y10T 137/2564; Y10T 137/2931; Y10T 137/87676

USPC .................................................. 118/726, 727
See application file for complete search history.

(56) References Cited

U.S. PATENT DOCUMENTS

| | | | |
|---|---|---|---|
| 6,432,205 B1 | 8/2002 | Lee et al. | |
| 8,017,527 B1* | 9/2011 | Dhas | C23C 16/4401 118/29 |
| 2007/0235085 A1 | 10/2007 | Nakashima et al. | |
| 2007/0266944 A1 | 11/2007 | Iizuka et al. | |
| 2009/0211525 A1* | 8/2009 | Sarigiannis | C23C 16/4481 118/707 |
| 2009/0214778 A1 | 8/2009 | Sarigiannis et al. | |
| 2009/0232986 A1 | 9/2009 | Choi et al. | |
| 2010/0136230 A1* | 6/2010 | Moriya | C23C 16/4402 427/185 |
| 2010/0242835 A1* | 9/2010 | Arena | C30B 25/02 117/102 |
| 2010/0305884 A1 | 12/2010 | Yudovsky et al. | |
| 2013/0019960 A1* | 1/2013 | Choi | C23C 16/4481 137/334 |

* cited by examiner

*Primary Examiner* — R. K. Arundale
(74) *Attorney, Agent, or Firm* — Servilla Whitney LLC

(57) ABSTRACT

Apparatus and methods for supplying a gas to a processing chamber are described. The apparatus comprises an inlet line, an outlet line and a fill line in fluid communication an ampoule. The apparatus described, and methods of use, allow a precursor ampoule to be refilled during processing without removing or replacing the ampoule and interrupting the process.

16 Claims, 2 Drawing Sheets

AUTO-REFILL AMPOULE AND METHODS OF USE

CROSS-REFERENCE TO RELATED APPLICATIONS

This application claims priority to U.S. Provisional Application No. 61/981,715, filed Apr. 18, 2014, the entire disclosure of which is hereby incorporated by reference herein.

FIELD

The disclosure pertains to a gas delivery system for a processing chamber. More specifically, embodiments of the disclosure are directed to gas delivery systems with hot-swappable ampoules.

BACKGROUND

Many semiconductor processing techniques use precursors or reactants which have been stored/shipped in ampoules. These precursors or reactants can gases, but are commonly solid or liquids. As many deposition processes, or etch processes, and the like, are gas phase interactions with a substrate surface, it is necessary to evaporate or sublimate the precursors or reactants.

For example, a typical solid precursor would be sublimated using a carrier or purge gas. The carrier gas is passed into an ampoule containing the solid precursor. The solid precursor sublimates and passes, with the carrier gas, and into a processing chamber. Once the level of precursor in the ampoule has decreased below a certain level, the ampoule must be changed to provide a fresh supply of precursor.

Ampoules for use with processing chambers contain precursor materials that are typically solid or liquids. The precursor sublimates or evaporates and fills the headspace of the ampoule. The concentration of precursor in the headspace is dependent upon, amongst others parameters, the vapor pressure and the temperature of the precursor within the ampoule. A gas or liquid flowing through the ampoule will carry precursor molecules from the headspace out of the ampoule causing a decrease in the amount of precursor within the ampoule. Evaporative cooling causes a decrease in the temperature of the contents which causes a decrease in the vapor pressure of the precursor. As precursor is removed from the ampoule, the concentration of precursor flowing from the ampoule decreases because there is less precursor in the headspace.

Therefore, there is a need in the art for apparatus and methods to maintain the amount of precursor in the headspace of a precursor ampoule.

SUMMARY

One or more embodiments of the disclosure are directed to gas delivery systems comprising an ampoule, an inlet line, a fill line and an outlet line. The inlet line is in fluid communication with the ampoule and has an ampoule inlet valve to control a flow of a carrier gas into the ampoule. The fill line is in fluid communication with ampoule and has a fill inlet valve to control a flow of a precursor into the ampoule. The outlet line is in fluid communication with the ampoule and has an ampoule outlet valve to control a flow of gas exiting the ampoule.

Additional embodiments of the disclosure are directed to gas delivery systems comprising an ampoule within an enclosure, an inlet line, a fill line and an outlet line. The inlet line is in fluid communication with the ampoule and has an ampoule inlet valve to control a flow of a carrier gas into the ampoule. The fill line is in fluid communication with ampoule and has a fill inlet valve to control a flow of a precursor into the ampoule. The fill line is in fluid communication with a precursor line and a purge gas line. The precursor line comprises a precursor line valve to control a flow of precursor through the precursor line. The outlet line is in fluid communication with the ampoule and has an ampoule outlet valve to control a flow of gas exiting the ampoule.

Further embodiments of the disclosure are directed to processing methods. An ampoule is provided which contains an initial amount of a precursor at an initial temperature. A flow of carrier gas is provided through the ampoule so that the carrier gas exiting the ampoule comprises precursor molecules. A refill flow of precursor is provided to the ampoule to add precursor to the ampoule without disconnecting the carrier gas. One or more of the amount of precursor and the temperature of the precursor in the refill flow is controlled so that one or more of the amount of precursor and the temperature of the precursor in the ampoule is about that of the initial amount or initial temperature.

BRIEF DESCRIPTION OF THE DRAWINGS

So that the manner in which the exemplary embodiments of the present invention are attained and can be understood in detail, a more particular description of the disclosure, briefly summarized above, may be had by reference to the embodiments thereof which are illustrated in the appended drawings. It is to be appreciated that certain well known processes are not discussed herein in order to not obscure the invention.

DETAILED DESCRIPTION

Embodiments of the disclosure provide apparatus and methods to refill or increase the amount of precursor in an ampoule during processing. Additionally, the temperature of the precursor can be increased to a specified level. For example, the temperature of the precursor decreases during use of the ampoule. A low temperature (about 85 to 135° C.) ampoule can decrease temperature by about 5-10° C. during use. A warm (relative to the ampoule) supply of precursor can be added to bring the temperature of the bulk precursor in the ampoule to a pre-determined level (e.g., the temperature of the precursor at the onset of processing).

Figure 1:
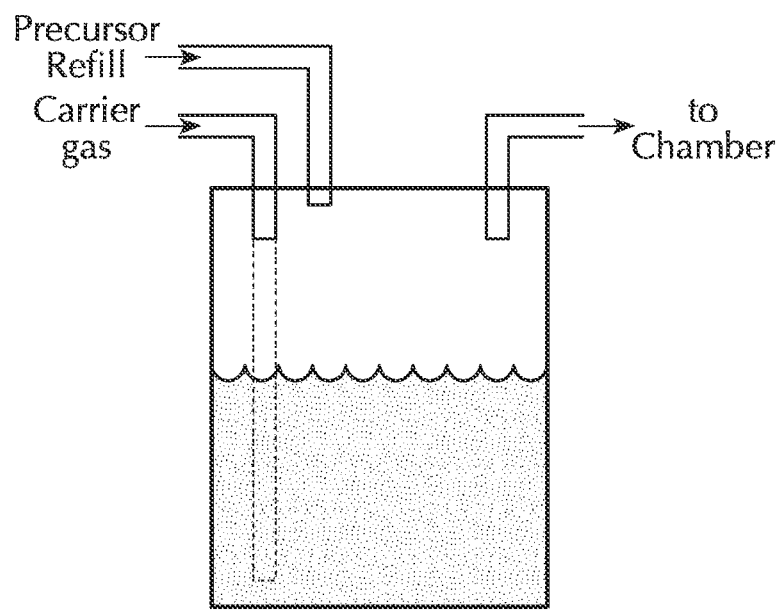
FIG. 1 shows a schematic of an ampoule in accordance with one or more embodiments of the disclosure.

FIG. 1 shows an ampoule with a liquid precursor. The carrier gas enters the ampoule and can either bubble through (shown in phantom) the precursor or flow across the surface (shown in solid). After picking up precursor molecules, the carrier gas/precursor exits the ampoule. A precursor fill refill line connects to the ampoule and can be connected to a precursor source for refilling purposes. The precursor refill, in the case of a liquid, can be added at the top of the ampoule (as shown) or can be added to the bottom of the ampoule. When added to the top, the additional precursor can be provided with sufficient pressure to suitably mix the precursor to equilibrate temperature more quickly than by simple diffusion.

The temperature of the incoming precursor can be controlled based on, for example, the volume of precursor being added, the volume of precursor present in the ampoule and the temperature of the precursor in the ampoule.

A warm precursor fill can be used in place of heating the ampoule. The ampoule can be filled with warm precursor immediately prior to the onset of processing and can be replenished at set intervals to maintain the precursor temperature.

Figure 2:
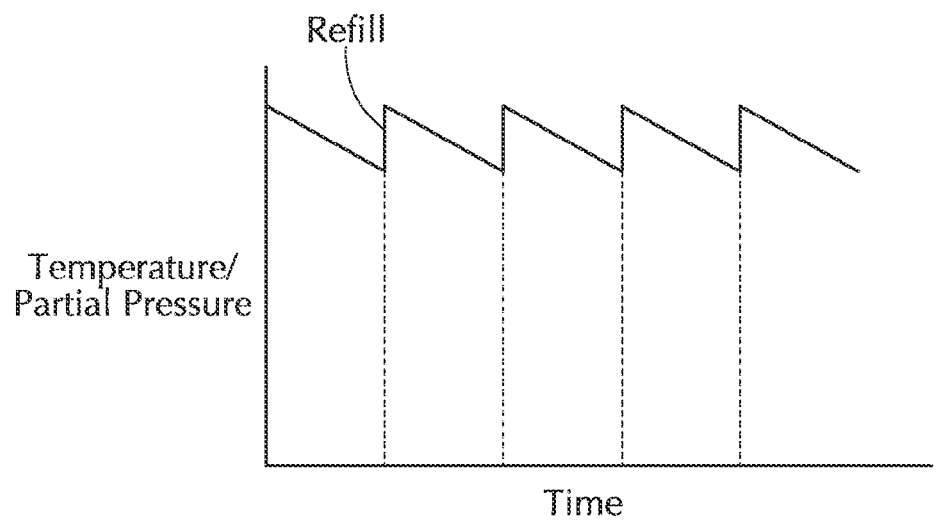
FIG. 2 shows a graph of the temperature or partial pressure of precursor in an ampoule as a function of time.

The refill period can be set to coincide with processing events like loading/unloading. For example, the refill can be aligned with the carousel load so that each batch has an equivalent processing starting point. FIG. 2 shows a graph of the temperature or partial pressure of precursor as a function of time for a processing sequence. Each refill period can occur at the same intervals or different intervals. The graph shows, for example, a batch processing chamber in which the precursor is refilled while the substrates are unloaded/loaded.

Embodiments of the disclosure can be used with solid precursors or liquids that are either used in a bubbler or vapor draw mode. In liquid delivery systems using higher vapor pressure precursors (e.g., $SiCl_4$, $TiCl_4$, TMA), stabilization of pressure in the ampoule may be helpful to ensure repeatable dosing.

Figure 3:
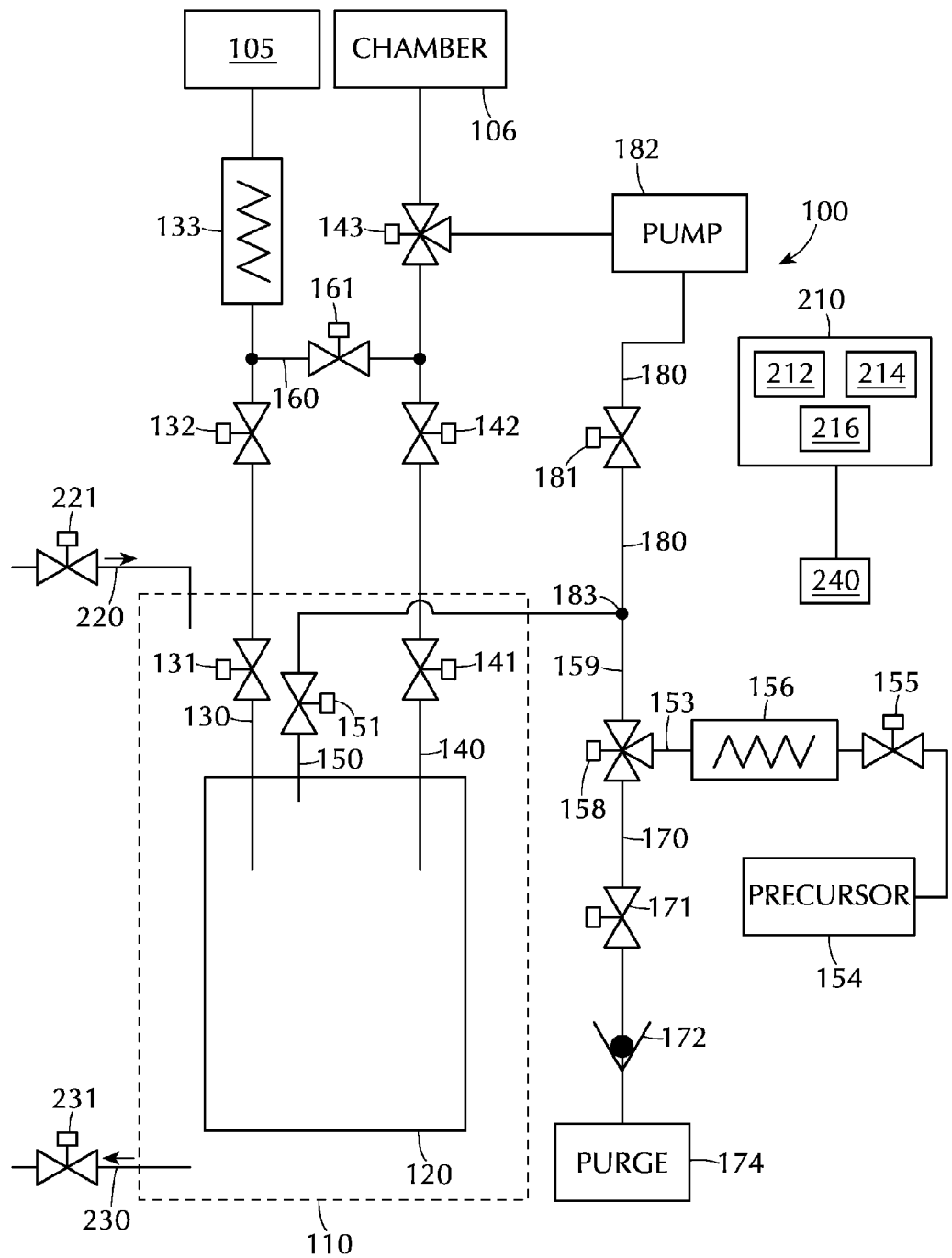
FIG. 3 shows a schematic of a process gas delivery system in accordance with one or more embodiments of the disclosure.

FIG. 3 shows a simplified schematic of a process gas delivery system 100 in accordance with one or more embodiments of the disclosure. The process gas delivery system 100 is suitable for producing a process gas containing a chemical precursor and generally includes a process chamber 106 and a carrier gas source 105 coupled to gas panel, the components of the latter being controlled by a controller. The gas panel generally controls the rate and pressure at which various process and carrier gases are delivered to process chamber. The process chamber may be a chamber to conduct vapor deposition processes or thermal processes containing a vaporized chemical precursor in liquid, gaseous or plasma state. Process chamber is generally a chemical vapor deposition (CVD) chamber, an atomic layer deposition (ALD) chamber, or a derivative thereof.

The process gas delivery system 100, also referred to as a fluid delivery circuit is generally intended to fluidly couple carrier gas source 105, ampoule 120, and process chamber 106 for operation of the process chamber 106. Carrier gas source 105 may be a local vessel, remote vessel or a centralized facility source that supplies the carrier gas throughout the facility (e.g., in-house gas supply). Carrier gas source 105 typically supplies a carrier gas such as nitrogen, hydrogen, argon, helium, or combinations thereof. Additional purge fluid sources (not shown) may also be fluidly coupled when the use of specialized purge fluids, such as a purge liquid, is incorporated.

The gas delivery system 100 comprises an ampoule 120 within an inlet line 130, and outlet line 140 and a fill line 150. The inlet line 130 allows a flow of carrier gas 105 to enter the ampoule 120. The flow of carrier gas can be through one or more valves, heaters, junctions, flow controllers, etc., which are positioned in fluid communication with the inlet line 130. As used in this specification and the appended claims, the term "fluid communication" means that a fluid can flow through the named components with no or minimal disruption to the flow or leakage. The inlet line 130 includes an ampoule inlet valve 131 to control a flow of carrier gas into the ampoule 120.

Additionally, the inlet line 130 shown in FIG. 3 includes an inlet line disconnect valve 132 and a thermal element 133 in fluid communication with the carrier gas. The inlet line disconnect valve 132 allows the ampoule to be removed without letting gas in the inlet line upstream of the inlet line disconnect valve 132 from leaking out of the system. The thermal element 133 can be used to heat (e.g., a heater) or cool (e.g., a cooler) the gas within the inlet line.

An outlet line 140 extends from the ampoule 120 to the processing chamber 106. The gas flowing through the outlet line 140 may pass through one or more valves, thermal elements, flow controllers, etc., which are in fluid communication with the outlet line 140. The outlet line includes an ampoule outlet valve 141 which can be used to control a flow of gas exiting the ampoule. Outlet line disconnect valve 142 can be used to isolate the outlet line 140 to allow the ampoule to be removed. For example, the inlet line disconnect valve 132 and outlet line disconnect valve 142 can be set to a closed position to prevent the flow of fluid through the respective valves. While not necessary, the ampoule inlet valve 131 and ampoule outlet valve 141 can also be set to the closed position. Once the valves are closed, the ampoule can be removed from the system without leakage of gases from the system. If the ampoule inlet valve and outlet valve are closed, there will be no leakage of fluid into or out of the ampoule.

A three-way valve 143 is shown positioned along the outlet line 140 between the bypass line 160 and the chamber 106. The three-way valve 143 is also in fluid communication with a vacuum pump 182. The three-way valve can be any suitable valve (e.g., a gradient proportioning valve) that can control the flow of gas to the processing chamber 106 and/or the vacuum pump 182.

A bypass line 160 is positioned upstream of the inlet line disconnect valve 132 and downstream of the outlet line disconnect valve 142. A bypass valve 161 is in fluid communication with the bypass line 160 and lets a gas flowing through the inlet line 130 to bypass the ampoule 120 and flow directly into the outlet line 140. Closing the inlet line disconnect valve 132 and outlet line disconnect valve 142 while the bypass valve 161 is open allows the fluid in the inlet line to pass to the outlet line without leakage.

A fill line 150 is also in fluid communication with the ampoule 120. The fill line 150 includes a fill inlet valve 151 which can be used to control the flow of fluid (or precursor) in the fill line. The fill line 150 can be in fluid communication with a precursor line 153 which is in fluid communication with a precursor 154. A precursor line valve 155 can be positioned along the precursor line 153 in fluid communication therewith to control the flow of precursor 154 through the precursor line 153. A thermal element 156 is shown on the precursor line 153 which can be used to heat and/or cool the precursor flowing through the precursor line 153.

The precursor line valve 155 can be an automatic valve which can be controlled by a computer or controller. In some embodiments, the precursor line valve 155 can also be a manual valve controllable by hand. In one or more embodiments the precursor line valve 155 can be controlled either automatically or manually. In some embodiments there are two valves; one controlled automatically and one controlled manually.

The fill line 150 can also be in fluid communication with a purge gas line 170 which is connected to a purge gas 174 source. The purge gas line 170 shown includes a purge gas line valve 171 to control the flow of purge gas through the purge gas line 170. As used in this specification and the appended claims, "controlling the flow" means that the rate or mass of fluid through the respective line can be varied from a complete stoppage of flow to a maximum flow.

In some embodiments, the purge gas line 170 includes a check valve 172 to prevent a flow of fluid in the purge gas line 170 from moving toward the purge gas 174 source. This can help prevent contamination of the purge gas source with precursor in the event there is backflow through the purge gas line. In the embodiment shown, the check valve 172 is upstream of the purge gas line valve 171. The order of the check valve 172 and purge gas line valve 171 can be reversed in some embodiments.

In the embodiment shown in FIG. 3, the fill line 150 is in fluid communication with a precursor line 153 and a purge gas line 170. The precursor line 153 and purge gas line 170 can connect to the fill line 150 through a wye or a three-way valve 158. In the embodiment shown, a fill line leg 159 connects the three-way valve 158 with the fill line 150.

In some embodiments, the gas delivery system 100 further comprises a pump line 180 in fluid communication with the fill line 150 and a vacuum pump 182. The pump line 180 may include pump line valve 181 to control the flow of gas through the pump line 180 toward the vacuum pump 182. The pump line 180 and the fill line leg 159 are shown connected to the fill line 150 at wye 183. However, the wye 183 can be replaced by a three-way valve or other suitable connection.

The gas delivery system of claim 1, wherein the ampoule is within an enclosure and the enclosure is in fluid communication with a purge gas.

A controller 210 includes central processing unit (CPU) 212, memory 214, and support circuits 216. Central processing unit 212 may be one of any form of computer processor that can be used in an industrial setting for controlling various chambers and sub-processors. Memory 214 is coupled to CPU 212 and may be one or more of readily available memory such as random access memory (RAM), read only memory (ROM), flash memory, compact disc, floppy disk, hard disk, or any other form of local or remote digital storage. Support circuits 216 are coupled to CPU 212 for supporting CPU 212 in a conventional manner. These circuits include cache, power supplies, clock circuits, input/output circuitry, subsystems, and the like.

Any of the valves, junctions and merge connectors can be remotely controllable, (e.g., remote shut-off valves). The valves of some embodiments are pneumatically or electronically controlled and the internal wetted surfaces thereof are fabricated from materials compatible with the process and other fluids handled by the fluid delivery circuit. Typically, the valves are actuated in response to a signal from a controller 210 to coordinate the delivery of gases through fluid delivery circuit. Sensors may be positioned throughout the fluid delivery circuit and are generally adapted to detect the temperature of a process, carrier, and/or purge fluid flowing through the lines, such as a thermocouple or flow sensor.

Ampoule 120 may have a variety of sizes and geometries. The ampoule may have a volume capacity of a chemical precursor within a range from about 0.5 L to about 10 L and more typically from about 1.2 L to about 4 L. In one example, ampoule assembly has a volume capacity of a chemical precursor of about 2.5 L. Chemical precursors that may be within ampoule assembly include liquid, solid and gaseous precursors, preferably in liquid or fluid-like states at predetermined temperatures and/or pressures. For example, a chemical precursor may exist in the solid state at room temperature, but melts to the liquid state upon being heated to a predetermined temperature within the ampoule. In another example, the majority of a chemical precursor may remain in the solid state in the ampoule, but is heated to an elevated temperature during processing such that an amount of the solid precursor sublimates directly into vapor. In another example, a chemical precursor may exist in the gaseous state at ambient pressure, but condenses to the liquid state upon being pressurized to a predetermined pressure within the ampoule.

In some embodiments, the ampoule 120 is positioned within an enclosure 110. The enclosures 110 are containers suitable for enclosing the ampoule 120 with access for the inlet line 130, outlet line 140 and fill line 150. Generally the enclosure 110 has a door which can be closed and, possibly, locked. In the event that the ampoule, or one of the lines, has a leak, hazardous buildup of gases could occur within the enclosure. To prevent this, some embodiments of the enclosure include an enclosure purge line 220 in fluid communication with the carrier gas or a purge gas. The purge line could be a separate gas source or drawn off from the carrier gas. The enclosure purge line 220 may include an enclosure purge valve 221 to meter the purge gas entering the enclosure 110. The purge gas can enter the enclosure through a wall of the enclosure.

In some embodiments the enclosure 110 includes an enclosure exhaust line 230 with an optional enclosure exhaust valve 231. The enclosure exhaust line can be in fluid communication with the vacuum pump 182 or a separate vacuum line.

The enclosure 110 can have one of the enclosure purge line 220 or enclosure exhaust line 230. However, it may be helpful to have both an enclosure purge line 220 and an enclosure exhaust line 230 so provide a steady flow of purge gas within the enclosure 110. This will effectively prevent the buildup of harmful chemicals in the enclosure 110 which could impact the operator who opens the enclosure 110.

Additionally, some embodiments include a safety interlock 240 which may be connected to the controller 210 and the enclosure 110. The safety interlock may include sensors to evaluate the atmosphere within the enclosure 110 or to evaluate the presence or absence of precursor exiting the ampoule 120, or other functions. If a predetermined condition is met (e.g., atmospheric contaminants above a certain level or opening of the enclosure door), the safety interlock could stop the process in the processing chamber or automatically switch the precursor source for the processing chamber to the other enclosure 110. For example, during a deposition process, the ampoule becomes low on precursor. An operator may change the ampoule to allow the process to continue uninterrupted, but forgets to switch the flow of precursor gas to the other enclosure. The safety interlock 240 can prevent the enclosure 110 door from opening or, through the controller 210, switch the ampoule source to the other enclosure, if possible, or stop the process.

While the foregoing is directed to embodiments of the present invention, other and further embodiments of the disclosure may be devised without departing from the basic scope thereof, and the scope thereof is determined by the claims that follow.

What is claimed is:

1. A gas delivery system comprising:
   an ampoule;
   an inlet line in fluid communication with the ampoule, the inlet line having an ampoule inlet valve to control a flow of a carrier gas into the ampoule;
   a fill line in fluid communication with the ampoule, a precursor line and a purge gas line, the fill line having a fill inlet valve to control a flow of a precursor into the ampoule, the precursor line and purge gas line connecting to the fill line at a three-way valve; and an outlet line in fluid communication with the ampoule and having an ampoule outlet valve to control a flow of gas exiting the ampoule.

2. The gas delivery system of claim 1, wherein the fill line is in fluid communication with the three-way valve through a fill line leg.

3. The gas delivery system of claim 1, wherein the precursor line comprises a precursor line valve in fluid communication with the precursor line to control a flow of precursor through the precursor line.

4. The gas delivery system of claim 3, wherein the precursor line valve is an automatic valve.

5. The gas delivery system of claim 3, wherein the precursor line valve is a manual valve.

6. The gas delivery system of claim 1, wherein the purge gas line comprises a purge gas line valve to control a flow of gas in the purge gas line.

7. The gas delivery system of claim 1, wherein the purge gas line comprises a check valve in fluid communication with the purge gas line to prevent a flow of gas in the purge gas line from moving away from the fill line.

8. The gas delivery system of claim 7, wherein the check valve is positioned upstream of a purge gas line valve.

9. The gas delivery system of claim 2, further comprising a pump line in fluid communication with the fill line.

10. The gas delivery system of claim 9, wherein the pump line comprises a pump line valve to control a flow of fluid through the pump line.

11. The gas delivery system of claim 10, wherein the pump line and the fill line leg connect to the fill line at a wye.

12. The gas delivery system of claim 1, wherein the inlet line comprises a heater upstream of the ampoule to heat the gas within the inlet line.

13. The gas delivery system of claim 1, wherein the fill line comprises a thermal element to control a temperature of the precursor in the fill line.

14. The gas delivery system of claim 1, wherein the ampoule is within an enclosure and the enclosure is in fluid communication with a purge gas.

15. A gas delivery system comprising:

an ampoule within an enclosure;

an inlet line in fluid communication with the ampoule, the inlet line having an ampoule inlet valve to control a flow of a carrier gas into the ampoule;

a fill line in fluid communication with ampoule, the fill line having a fill inlet valve to control a flow of a precursor into the ampoule, the fill line in fluid communication with a precursor line and a purge gas line, the precursor line comprising a precursor line valve to control a flow of precursor through the precursor line; and an outlet line in fluid communication with ampoule and having an ampoule outlet valve to control a flow of gas exiting the ampoule, wherein the precursor line and the purge gas line connect to a three-way valve and an outlet of the three-way valve is in fluid communication with a fill line leg, the fill line leg being in fluid communication with the fill line.

16. The gas delivery system of claim 15, wherein the precursor line further comprises a thermal element to control a temperature of the precursor in the precursor line.

* * * * *